(12) United States Patent
Cernea

(10) Patent No.: US 6,922,096 B2
(45) Date of Patent: Jul. 26, 2005

(54) AREA EFFICIENT CHARGE PUMP

(75) Inventor: Raul-Adrian Cernea, Santa Clara, CA (US)

(73) Assignee: SanDisk Corporation, Sunnyvale, CA (US)

(*) Notice: Subject to any disclaimer, the term of this patent is extended or adjusted under 35 U.S.C. 154(b) by 0 days.

(21) Appl. No.: 10/636,839

(22) Filed: Aug. 7, 2003

(65) Prior Publication Data

US 2005/0030088 A1 Feb. 10, 2005

(51) Int. Cl.[7] ............................................. G05F 1/10
(52) U.S. Cl. ......................................................... 327/536
(58) Field of Search .................................. 327/530, 534, 327/536, 537

(56) References Cited

U.S. PATENT DOCUMENTS

| | | | |
|---|---|---|---|
| 3,824,447 A | * | 7/1974 | Kuwabara .................... 363/60 |
| 4,271,461 A | | 6/1981 | Hoffmann et al. |
| 5,008,799 A | | 4/1991 | Montalvo |
| 5,059,815 A | | 10/1991 | Bill et al. |
| 5,397,931 A | | 3/1995 | Bayer |
| 5,436,587 A | | 7/1995 | Cernea |
| 5,801,577 A | * | 9/1998 | Tailliet ....................... 327/536 |
| 5,874,850 A | | 2/1999 | Pulvirenti et al. |
| 6,278,315 B1 | * | 8/2001 | Kim ........................... 327/536 |
| 6,370,075 B1 | | 4/2002 | Haeberli et al. |
| 6,545,529 B2 | * | 4/2003 | Kim ........................... 327/536 |
| 2004/0061548 A1 | | 4/2004 | Cernea |

OTHER PUBLICATIONS

"Notification of Transmittal of the International Search Report or the Declaration", corresponding PCT application No. PCT/US2004/024064, International Searching Authority, European Patent Office, Jul. 27, 2004, 13 pages.

* cited by examiner

*Primary Examiner*—Jeffrey Zweizig
(74) *Attorney, Agent, or Firm*—Parsons Hsue & De Runtz LLP

(57) ABSTRACT

A first charge pump includes a collection of voltage adder stages. The first voltage adder stage receives an input voltage VCC and in response to a clock signal provides a first voltage signal alternating between 2*VCC and VCC. The Nth voltage adder stage receives an input voltage VCC and a first voltage signal from the preceding stage, and provides a second voltage signal alternating between N*VCC and VCC. The capacitors included within each adder stage are required to sustain a maximum voltage of VCC. In an alternate embodiment the first charge pump may be combined with one or more voltage doubler stages to produce even higher output voltages.

21 Claims, 5 Drawing Sheets

Charging half cycle

Transfer half cycle

AREA EFFICIENT CHARGE PUMP

FIELD OF THE INVENTION

This invention pertains generally to voltage generation circuits and more particularly to a charge pump circuit that is area efficient when implemented in applications such as an integrated circuit.

BACKGROUND OF THE INVENTION

Charge pumps use a switching process to provide a DC output voltage larger than its DC input voltage. In general, a charge pump will have a capacitor coupled to switches between an input and an output. During one clock phase, the charging half cycle, the capacitor couples in parallel to the input so as to charge up to the input voltage. During a second clock phase, the transfer half cycle, the charged capacitor couples in series with the input voltage so as to provide an output voltage twice the level of the input voltage. This process is illustrated in FIGS. 1a and 1b. In FIG. 1a, the capacitor 5 is arranged in parallel with the input voltage $V_{IN}$ to illustrate the charging half cycle. In FIG. 1b, the charged capacitor 5 is arranged in series with the input voltage to illustrate the transfer half cycle. As seen in FIG. 1b, the positive terminal of the charged capacitor 5 will thus be $2*V_{IN}$ with respect to ground.

The generic charge pump described above will transfer power only during the transfer half cycle. U.S. Pat. No. 5,436,587, the contents of which are hereby incorporated by reference, discloses a charge pump having a voltage adder stage followed by a plurality of voltage doubler stages, wherein each stage transfers power on every clock phase. Each stage includes two capacitors that cycle according to a charging half cycle and a transfer half cycle as described above. However, the two capacitors are driven in a complementary fashion such that when one is charging the other is transferring power and vice versa. In this manner, each stage may transfer power during each clock phase. The voltage adder stage may be denoted an adder because, in response to receiving a DC supply voltage (VCC) and a CLK signal of amplitude VCC, the adder stage provides a DC output voltage equal to VCC+VCC. The voltage doubler stages are arranged in series such that the Nth voltage doubler stage receives as its input voltages the output voltages produced by the (N−1)th voltage doubler stage. The voltage doubler stages may be denoted as doublers because each voltage doubler stage receives an input voltage and provides an output voltage equaling twice its input voltage. Although the voltage doubler stages provide higher output voltages than that produced by the voltage adder stage, greater voltage stress occurs across the capacitors in the voltage doubler stages as compared to those in the voltage adder stage. Specifically, the capacitors in the Nth voltage doubler stage will have to withstand a voltage stress of $VCC*2^{(N-1)}$, whereas the capacitors in the voltage adder stage need withstand only a voltage stress of VCC. Because the capacitors in the voltage doubler stages must withstand greater voltage stresses, these capacitors require a thicker oxide insulation layer to prevent dielectric breakdown and shorting. In general, if the maximum voltage to be sustained between the plates of a capacitor is increased by a factor of m, the separation must also be increased by this same factor.

The thicker oxide required for the capacitors used in voltage doubler stages affects the chip area required for these stages as follows. Although this discussion assumes a parallel plate topology for the capacitors used, it is equally applicable to other capacitor topologies. A parallel plate capacitor's capacitance C is proportional to the area A of the capacitor's plates divided by their separation D. In an integrated circuit process a specific oxide thickness is generally provided that is optimized to reliably sustain the power supply voltage, VCC, and is typically called the gate oxide thickness. There is often one other oxide thickness provided that can reliably sustain the output voltage of the main charge pump, and this oxide may be referred to as the high voltage gate oxide. Typically this oxide thickness is 3 to 8 times thicker than that of the gate oxide and often only one type of transistor is provided with this oxide thickness (usually nMOS). Unfortunately it is very difficult and/or costly to provide additional oxides whose thickness can be optimized for any specific multiple of VCC. To achieve the same capacitance C as D is increased, the area A of each capacitor required to sustain more than VCC must also increase by a factor of 3 to 8, and this significantly decreases the amount of chip real estate available for other uses. This factor is so significant that the capacitor area may totally eclipse the area associated with all of the control transistors.

Another type of charge pump is disclosed in U.S. application Ser. No. 10/260,115 entitled "Charge Pump with Fibonacci Number Multiplication," filed Sep. 27, 2002, the contents of which are hereby incorporated by reference. In this type of charge pump the voltage output of a given stage is the sum of the outputs of the preceding two stages. The disclosed implementation includes one capacitor per stage, but like that shown in U.S. Pat. No. 5,436,587 referenced earlier, the capacitor must be capable of sustaining a progressively higher voltage at each stage, and thus suffers the same disadvantage of large capacitor area.

Accordingly, there is a need in the art for area-efficient charge pumps.

SUMMARY

An area efficient charge pump is comprised of stages that successively boost voltage. Stages are configured so that individual capacitors in a stage do not have high voltages applied across their dielectric. Thus, even where a stage has a voltage output that is several times the input voltage of the charge pump, the capacitor dielectric is only subject to a voltage that is approximately the input voltage of the charge pump. This allows thinner capacitor dielectric to be used. Capacitors may thus be made smaller in area than they would be if they were to sustain high voltages.

In accordance with one aspect of the invention, a charge pump includes N voltage adder stages arranged in cascade. The first voltage adder stage receives a DC supply voltage VCC and is operable to provide, in response to a clock signal, a first voltage signal and its complement, the first voltage signal being substantially equal to 2*VCC during a first phase of the clock signal and VCC during a second phase of the clock signal, complement voltage signal being substantially equal to VCC during a first phase of the clock signal and 2*VCC during a second phase of the clock signal. The Nth voltage adder stage receives the (N−1)th voltage signal and its complement and is operable to provide, in response to the clock signal, a Nth voltage signal and its complement, the Nth voltage signal being substantially equal to (N+1)*VCC during the first phase of the clock signal and VCC during the second phase of the clock signal, the complement voltage signal being substantially equal to VCC during a first phase of the clock signal and (N+1)*VCC during a second phase of the clock signal.

In accordance with another aspect of the invention, the charge pump further includes a plurality of voltage doubler stages. A first voltage doubler stage in the plurality receives the Nth voltage signal and its complement, and provides a (N+1)th voltage signal and its complement to a second voltage doubler stage in the plurality, and so on. In general, a Kth voltage doubler stage in the plurality will receive the (K+N−1)th voltage signal and its complement, the kth voltage doubler stage operable to provide, in response to the clock signal, the (K+N)th voltage signal and its complement, the (K+N)th voltage signal being substantially equal to $2^{K}*((N+1)*VCC)$ during the first phase of the clock signal and $2^{(K-1)}*((N+1)*VCC)$ during the second phase of the clock signal. The complement of the (K+N)th voltage signal being substantially equal to $2^{(K-1)}*((N+1)*VCC)$ during the first phase of the clock signal and $2^{K}*((N+1)*VCC)$ during the second phase of the clock signal.

In accordance with yet another aspect of the invention, a method of generating a voltage output signal comprises receiving a supply voltage VCC and a clock signal. The supply voltage is added using two adder stages so as to produce a first voltage signal substantially equal to $3*VCC$. The first voltage signal may then be doubled at least once to produce the voltage output signal. In general, if the first voltage signal is doubled N times, the voltage output signal will be substantially equal to $3*VCC*2^N$.

The following description and figures disclose other aspects and advantages of the present invention.

DESCRIPTION OF THE DRAWINGS

The various aspects and features of the present invention may be better understood by examining the following figures, in which.

DETAILED DESCRIPTION

Figure 2:
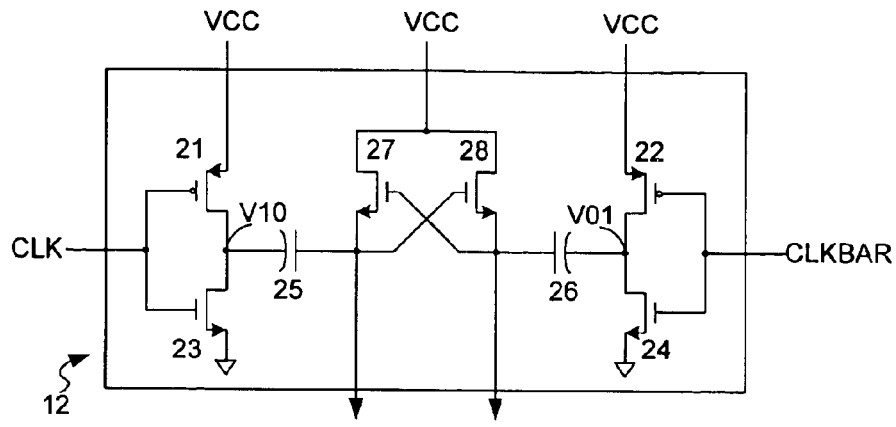
FIG. 2 is a circuit diagram for the first voltage adder stage of the charge pump of FIG. 5.

In FIG. 2, a circuit diagram for a first voltage adder stage 12 is illustrated. Two signals, CLK and its complement, CLKBAR, are inputs to this stage. These signals alternate between voltage levels VCC and ground at approximately a 50% duty cycle, such that when CLK is low, CLKBAR is high and when CLK is high, CLKBAR is low. In the description that follows, the voltage level of CLK will be defined as low (ground) during odd numbered half cycles, and high (VCC) during even numbered half cycles. For ease of explanation we will assume that the desired charge pump output voltage is positive with respect to a ground reference and that VCC is a more positive voltage than ground, but the techniques described are equally applicable to producing negative voltage charge pumps by suitable change of the reference level. As will be explained shortly, the name used to identify each voltage variable node, Vij with i and j as integers, is chosen to not only identify a unique node name but also indicate its approximate voltage levels in units of VCC during each of the two half cycles of CLK. For example, the voltage level on node V21 will be substantially equal to $2*VCC$ during the odd half cycles of CLK and $1*VCC$ during even half cycles of CLK. Similarly the voltage level on node V12 will be substantially equal to $1*VCC$ during the odd half cycles of CLK and $2*VCC$ during the even half cycles of CLK.

Referring to FIG. 2, the source of pMOS 21 is connected to an input voltage signal (shown in this figure as VCC) and its drain is connected to the drain of nMOS 23 as well as one side of capacitor 25 forming node V10. Similarly the source of pMOS 22 is connected to an input voltage signal (also shown as VCC) and its drain is connected to the drain of nMOS 24 as well as one side of capacitor 26 forming node V01. The source of both nMOS 23 and nMOS 24 are connected to ground. The other side of capacitors 25 and 26 are connected to output nodes V21 and V12 respectively. Also connected to V21 is the source of nMOS 27 and the gate of nMOS 28, and connected to V12 is the source of nMOS 28 and the gate of nMOS 27. The drain of both nMOS 27 and nMOS 28 are connected to VCC.

Capacitors 25 and 26 are typically formed from MOS transistors by connecting the source and drain together as one terminal and using the gate as the other terminal. Because the capacitance of an MOS transistor can vary with applied gate voltage, these transistors are preferably operated in the accumulation region as opposed to the inversion region commonly used in transistor operation, although operation in the inversion region is also possible. For example, if capacitor 25 is formed from a pMOS transistor, the source, drain, and local substrate (typically n-well) are connected together (indicated as the curved terminal) and attached to node V10, and the gate terminal (indicated as a flat plate) is attached to node V21. As will be demonstrated shortly, V21 is more positive than node V10 during each half cycle of CLK and thus attracts or accumulates electrons from the n-well to the surface. Under these conditions the capacitance is as large as possible and does not vary as the gate voltage changes.

The gates of nMOS 23 and a pMOS 21 both receive the CLK signal, and the gates of an nMOS 24 and a pMOS 22 receive the CLKBAR signal. During the odd half cycles of the CLK signal when CLK is low, pMOS 21 will be ON and nMOS 23 will be OFF. Because the source of pMOS 21 couples to the input voltage signal (VCC), node V10 at the drain of pMOS 21 will be substantially equal to VCC during these odd half cycles. As will be explained further, during the even half cycles of the CLK signal, capacitor 25 will be charged such that node V21 has a potential of VCC with respect to node V10. Thus, during the odd half cycles of the CLK signal, when node V10 is charged to VCC, the output voltage on node V21 will have a voltage substantially equal to $2*VCC$. Note that the charge stored on capacitor 25 may have been depleted slightly due to charge sharing, capacitive coupling, and/or leakage effects. Thus, the voltage across capacitor 25 may be slightly less than VCC during this time. As used herein, a voltage signal "substantially equal" to a desired level is understood to include any such losses.

During the odd half cycle of the CLK signal, the CLK-BAR signal will be high, turning nMOS 24 ON, pulling node V01 towards ground. Because node V21 has a voltage of 2*VCC at this time, nMOS 28 will be ON, bringing the output voltage on node V12 substantially equal to VCC, such that capacitor 26 will be charged to VCC with respect to node V01. At the same time, the gate of nMOS 27 will be charged to VCC since it couples to node V12. Because the source of nMOS 27 connected to node V21 is charged to 2*VCC at this time, nMOS 27 will be OFF, preventing voltage on node V21 from discharging back through this transistor. In summary, during the odd half cycle the ON transistors are pMOS 21, nMOS 24, and nMOS 28, and the OFF transistors are nMOS 23, pMOS 22, and nMOS 27.

During the even half cycles of the CLK signal, nMOS 23 is ON, bringing node V10 towards ground. Similarly pMOS 22 is ON, thereby charging node V01 to VCC. Because capacitor 26 was charged to VCC during the odd half cycle of the CLK signal with output node V12 being more positive than node V01 as described above, charging node V01 to VCC will cause the output voltage on node V12 to be substantially equal to 2*VCC at this time. This voltage signal couples to the gate of nMOS 27, turning it ON such that the output voltage at node V21 will be substantially equal to VCC. In this fashion, capacitor 25 will be charged to VCC with respect to the grounded node V10, validating the earlier assumption. In turn, because the gate of nMOS 28 is charged to VCC whereas its source is charged to 2*VCC, nMOS 28 will be OFF preventing output voltage on node V12 from discharging back through this transistor. In summary, during the even half cycle the ON transistors are pMOS 22, nMOS 23, and nMOS 27, and the OFF transistors are nMOS 24, pMOS 21, and nMOS 28.

Figure 3:
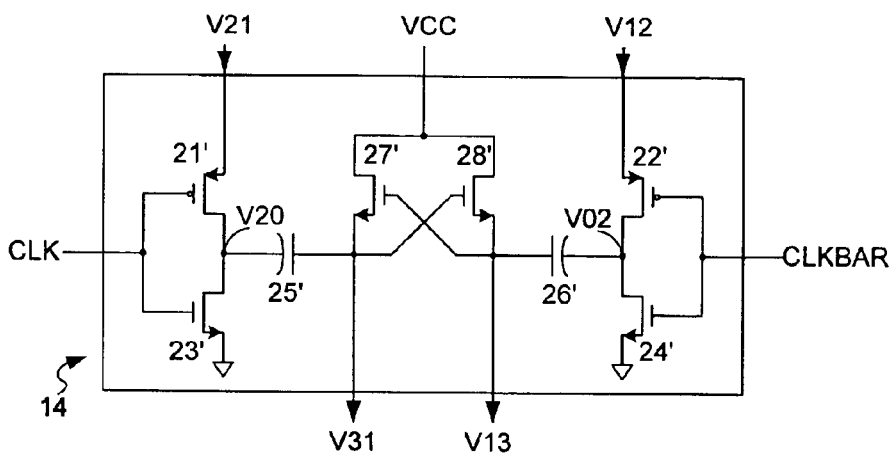
FIG. 3 is a circuit diagram for the second voltage adder stage of the charge pump of FIG. 5.

Turning now to FIG. 3, the operation of second voltage adder stage 14 is analogous, having the same structure as first voltage adder stage 12 with corresponding elements referenced with identical numbers followed by prime ('). However, rather than receiving VCC as the input voltage signal to the sources of pMOS 21' and 22', second voltage adder stage 14 receives input voltage signals V21 and V12 from first adder stage 12. Note that supply voltage VCC is still applied to nMOS 27' and 28'. During the odd half cycles of the CLK signal, pMOS transistor 21' will be ON, bringing node V20 to a voltage of 2*VCC. Assuming that capacitor 25' had been previously charged to VCC with respect to node V20, output voltage at node V31 will be substantially equal to 3*VCC during the odd half cycles of the CLK signal. This output voltage couples to the gate of nMOS 28', switching it ON such that node V13 will be charged to substantially VCC. This voltage signal couples to the gate of nMOS 27', switching it OFF and preventing output voltage on node V31 from discharging back through this transistor. At the same time, nMOS 24' will be ON, pulling node V02 towards ground such that capacitor 26' is charged to VCC with respect to node V02.

During the even half cycles of the CLK signal, nMOS 23' will be ON, pulling node V20 towards ground. At the same time, pMOS 22 will be ON, charging node V02 to a voltage of 2*VCC. Because capacitor 26' has already been charged to VCC with respect to node V02, the output voltage on node V13 will be substantially equal to 3*VCC. In turn, this output voltage level for V13 switches nMOS 27' ON, bringing output voltage on node V31 to be substantially equal to VCC. Thus capacitor 25' will be charged to VCC with respect to grounded node V20. Because node V31 is substantially equal to VCC at this time, nMOS 28' will be OFF, preventing the output voltage on node V13 from discharging back through this transistor.

Figure 4:
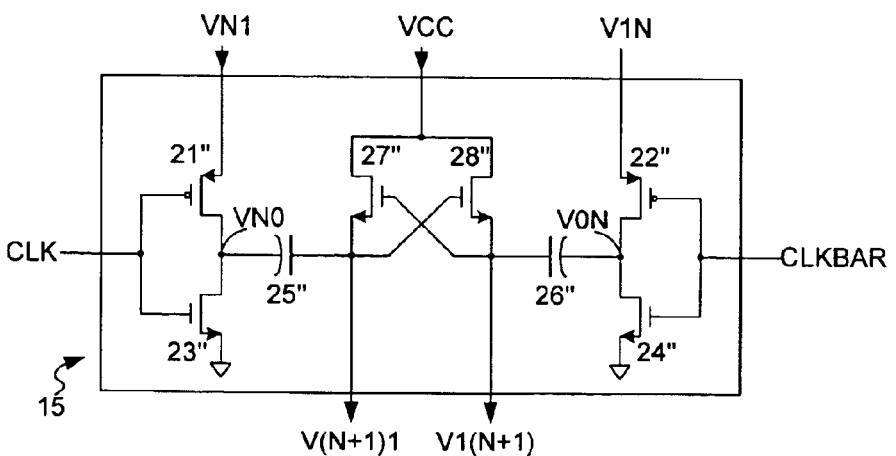
FIG. 4 is a circuit diagram for the Nth voltage adder stage of a charge pump employing more than two adder stages in FIG. 5.

FIG. 4 shows the Nth adder stage of a charge pump containing more than two adder stages and simply generalizes the principles discussed above in regards to FIGS. 2 and 3 when multiple adder stages are cascaded. As in those previous figures, corresponding elements are indicated by the same number followed by a double prime ("). The complementary input voltage signals are VN1 and V1N; if N is chosen to be 3, these would be identical with the outputs V31 and V13 of FIG. 3. Referring to the voltage across capacitor 25", note that it is between nodes V(N+1)1 and VN0, and that the net voltage across capacitor is always VCC, and similarly for capacitor 26". This is an important feature of cascaded adder charge pumps in that the large area capacitors can be fabricated with the same gate oxide as that used by the low voltage transistors, and are significantly smaller than capacitors used in doublers which are required to reliably sustain an applied voltage of N*VCC.

The operation of this stage is essentially identical to that of FIGS. 2 & 3. During the odd half cycles when CLK is low, pMOS 21" is turned on and charges node VN0 to N*VCC (the value of the input voltage VN1). Since capacitor 25" was previously charged to VCC with respect to node VN0, output node V(N+1)1 rises to (N+1)*VCC. During the even half cycles when CLK is high, nMOS 23" discharges node VN0 to ground, moving it by N*VCC. This change moves node V(N+1)1 to VCC and nMOS 27" insures it remains no lower than VCC since the gate signal of nMOS 27" is more positive at (N+1)*VCC than either its drain or source. Now the general principle of this voltage adder can be seen in that VCC (from nMOS 27") is applied to the output side of the capacitor while its other side is grounded, and subsequently the ground is released and N*VCC (from the preceding stage) is applied causing the output node to rise to (N+1)*VCC, effectively adding VCC to the output of the preceding stage.

Figure 1A:
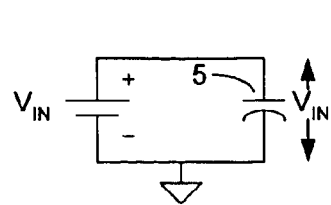
FIG. 1a is a simplified circuit diagram of the charging half cycle in a generic charge pump.
Figure 1B:
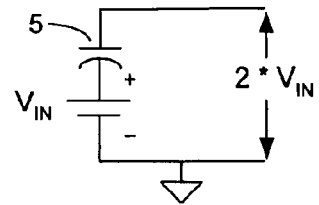
FIG. 1b is a simplified circuit diagram of the transfer half cycle in a generic charge pump.
Figure 5:
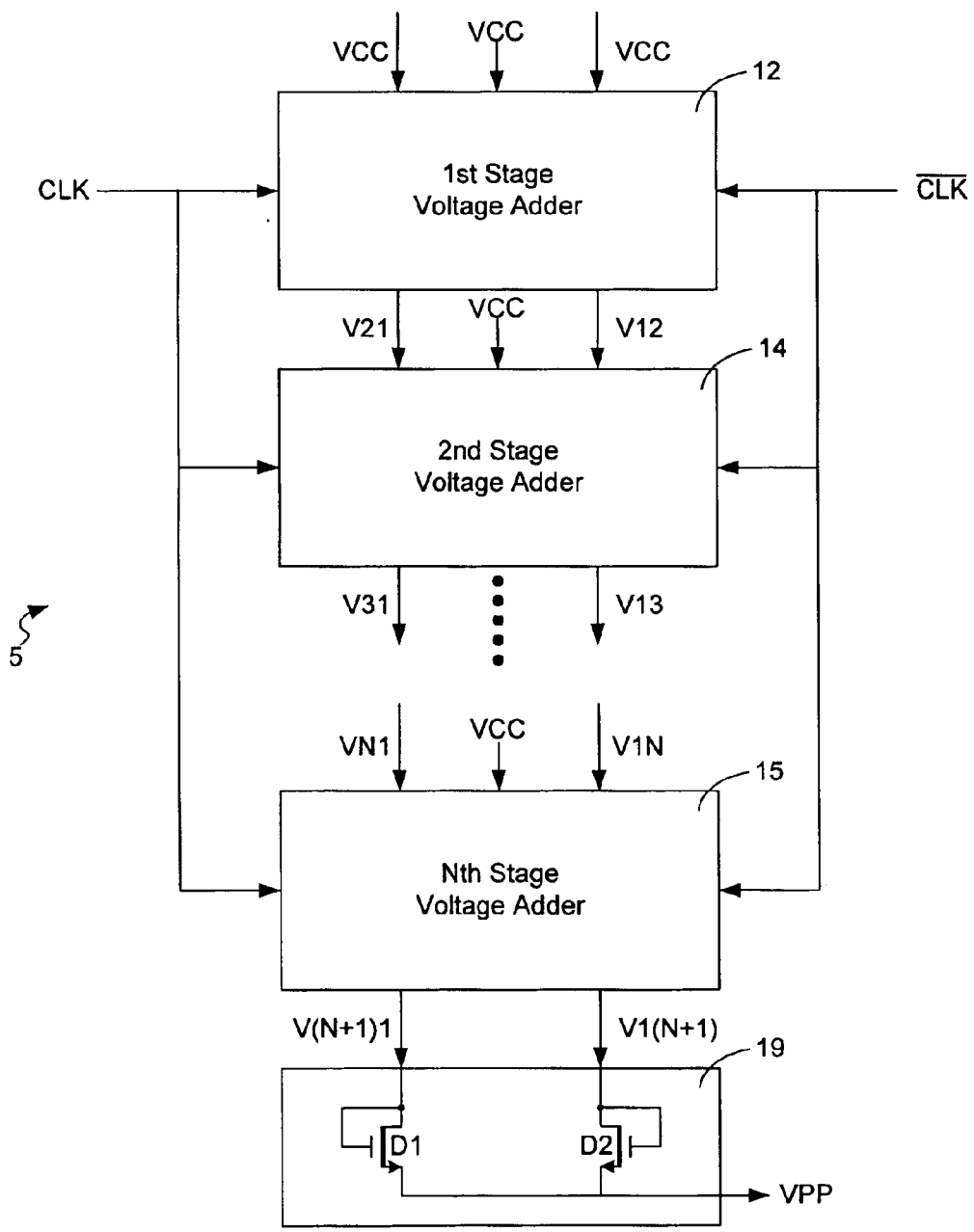
FIG. 5 is a block diagram of a charge pump according to one embodiment of the invention using adder stages.

FIG. 5 shows a block diagram of a charge pump 5 composed entirely of adder stages and an output stage. First stage 12 corresponds to FIG. 2; second stage 14 corresponds to FIG. 3; and Nth stage 15 corresponds to FIG. 4. In practice the output signals V(N+1)1 and V1(N+1) would be combined in such a way as to produce a constant output voltage VPP of value (N+1)*VCC. One method of accomplishing is shown in simplified form as stage 19. In this circuit two diodes D1 and D2 are used to form the output voltage VPP. The anode of diode D1 is connected to V(N+1)1 and the anode of diode D2 is connected to V1(N+1). The cathodes of both diodes are connected together to form the output voltage VPP. One way of implementing these diodes is to use a transistor and connect the gate and drain together as shown here. Preferably this transistor is a depletion nMOS device (shown in the diagram with a double line in the channel region) having a threshold voltage near 0 volts. In this case there will be negligible voltage drop across the diode connected transistor, and the output voltage will be close to (N+1)*VCC. If enhancement mode transistors are used, VPP would be reduced by the value of their threshold voltage.

The magnitude of the output current that this charge pump can supply to a load is principally determined by the absolute value of the capacitors and the clock frequency. Depending on the application, the output current may be relatively continuous (such as when driving a resistive load) or a transient current (such as when charging large amounts of circuit capacitance as, for example, a word line). During the odd half cycles of CLK when node V(N+1)1 is supplying the output voltage (N+1)*VCC, charge is transported from capacitor 25" to the load (through diode D1). Since the current supplied by a capacitor is C*ΔV/ΔT where ΔV is the change in voltage across the capacitor and ΔT is the time period over which this current is supplied, for a given clock half cycle time (ΔT) and allowable change in output voltage (ΔV), the magnitude of the current is directly proportional to the value of C. Generally the value of the capacitance and the clock frequency should be chosen such that ΔV remains less than 1 volt. If the clock frequency is set too high, the internal power losses in the charge pump may become undesirable. These losses include charging and discharging the stray and parasitic capacitances ($CV^2f$) and resistive losses in the MOS switches used to charge the main capacitors. One other feature to note about this charge pump is that the source of the output current is primarily from the VCC supply through nMOS 27" and nMOS 28", as these transistors directly charge the output capacitances, and thus supply the charge that is delivered to the load.

A charge pump comprising cascaded adder stages without multiplier stages can be advantageous when relatively lower output voltages and high currents are required because the smaller area of the capacitors required to sustain a maximum voltage of VCC more than offsets the additional number of stages required when compared to the conventional voltage doublers referenced earlier. However, typical flash EEPROM memory chips may require multiple charge pumps at differing power levels. Thus there may be situations where a number of cascaded adder stages may be desirably combined with one or more voltage multiplier stages. For example, if the output current required of the charge pump is relatively small, the size of the output capacitors may be such that the increased size of the internal capacitors needed in a doubler stage may be acceptable.

Figure 6:
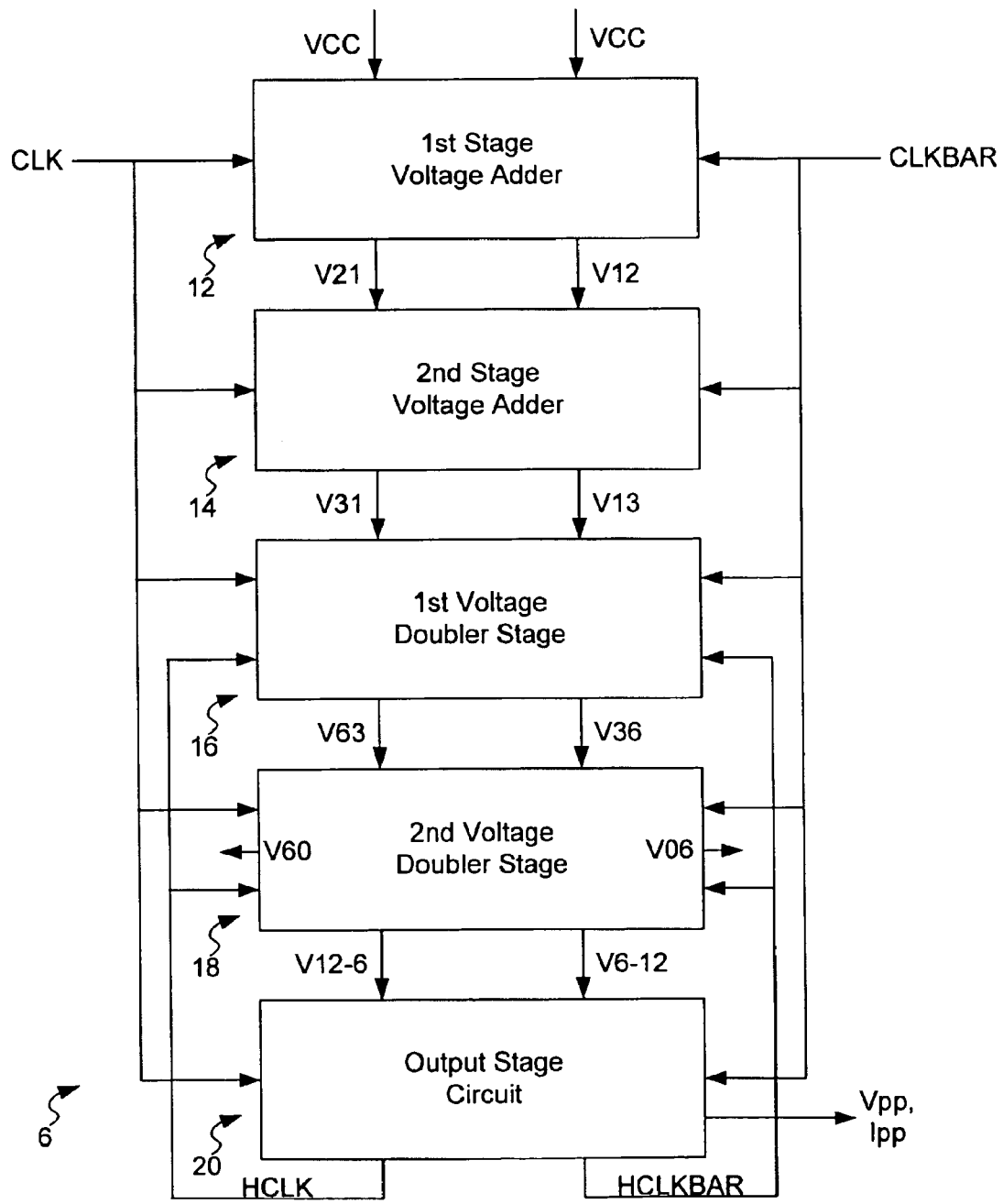
FIG. 6 is a block diagram of a charge pump according to a second embodiment of the invention using both adder and doubler stages.
Figure 7:
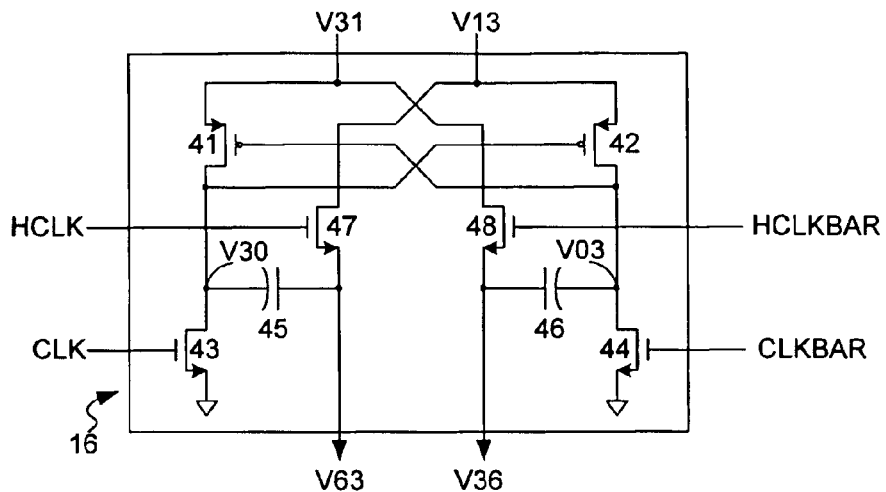
FIG. 7 is a circuit diagram for the first voltage doubler stage of the charge pump of FIG. 6.

An example of a charge pump using both adder and doubler stages is illustrated in FIG. 6. A charge pump 6 includes a first voltage adder stage 12 (such as that shown in FIG. 2), a second voltage adder stage 14, a first voltage doubler stage 16, a second voltage doubler stage 18, and an output stage 20. Each stage receives a clock signal CLK and its complement clock signal CLKBAR. A detailed circuit diagram for doubler stage 16 is shown in FIG. 7. Like the adder stages previously described, it includes four nMOS transistors, two pMOS transistors, and two capacitors, although they are connected differently. Unlike the adder, this stage does not use VCC as an input source of power, but extracts power from the complementary input signals V31 and V13 that in this example are obtained from the second adder stage 14, which was previously described using FIG. 3 as an example. Input signal V31 connects to the source of pMOS 41 whose drain is connected to the drain of nMOS 43, one side of capacitor 45, and the gate of pMOS 42 forming node V30. The gate of nMOS 43 is connected to CLK and its source is connected to ground. Similarly input signal V13 connects to the source of pMOS 42 whose drain is connected to the drain of nMOS 44, one side of capacitor 46, and the gate of pMOS 41 forming node V03. The gate of nMOS 44 is connected to CLKBAR and its source is connected to ground. Input signal V31 also goes to the drain of nMOS 48 whose gate is connected to HCLKBAR and in a similar fashion input signal V13 goes to the drain of nMOS 47 whose gate is connected to HCLK. HCLK is a high voltage form of CLK. In this example it is generated in stage 20 (FIG. 9) and could also be labeled V12;0. When CLK is low, HCLK is low; when CLK is high (VCC level), HCLK is high (M*VCC), where M*VCC is at least as large as the maximum input voltage to this stage. HCLKBAR has the same voltage levels as HCLK but is complementary to it in the same way that CLKBAR is complementary to CLK, and in this example could be labeled V0;12. Finally the source of nMOS 47 and the other side of capacitor 45 are connected to form output node V63, and the source of nMOS 48 and the other side of capacitor 46 are connected together to form output node V36.

Operation of this circuit will now be described. During odd half cycles of the CLK signal, mMOS 44 will be ON, pulling node V03 towards ground. In turn, the low voltage of node V03 switches pMOS 41 ON, such that input voltage signal V31 couples through this transistor and charges node V30 to a voltage of 3*VCC. Assuming that capacitor 45 has been previously charged to 3*VCC with respect to node V30, output node V63 at will be substantially equal to 6*VCC at this time. Because the high voltage clock HCLK is low during odd half cycles of the CLK signal, nMOS 47 is OFF, preventing voltage signal V63 from discharging back through nMOS47 into node V13, which is at VCC during these odd half cycles. At the same time, complementary high voltage clock HCLKBAR is high, switching nMOS 48 ON such that voltage signal V31 will charge capacitor 46 to a voltage of 3*VCC with respect to node V03. Because of the high voltage 3*VCC at node V30, pMOS 42 is OFF, preventing the low voltage at node V03 from pulling down voltage signal V13.

During even half cycles of the CLK signal, CLK is high, switching nMOS 43 ON to pull node V30 low. The HCLK signal will also be high, switching nMOS 47 ON so that voltage signal V13 will be coupled to node V63 bringing it substantially equal to 3*VCC. In turn, this voltage at node V63 will charge capacitor 45 to 3*VCC with respect to grounded node V30, as assumed in the previous discussion of the CLK odd half cycles. Because node V30 is grounded, pMOS 42 will be ON, and input V13 will bring node V03 to a voltage of 3*VCC. At the same time, the CLKBAR signal will be low, switching nMOS 44 OFF, preventing node V03 from being pulled to ground. In turn, because capacitor 46 was already charged to a voltage of 3*VCC with respect to node V03, node V36 will be substantially equal 6*VCC. Signal HCLKBAR is low, thereby switching nMOS 48 OFF and preventing voltage signal V36 from discharging back to V31 through this transistor.

Figure 8:
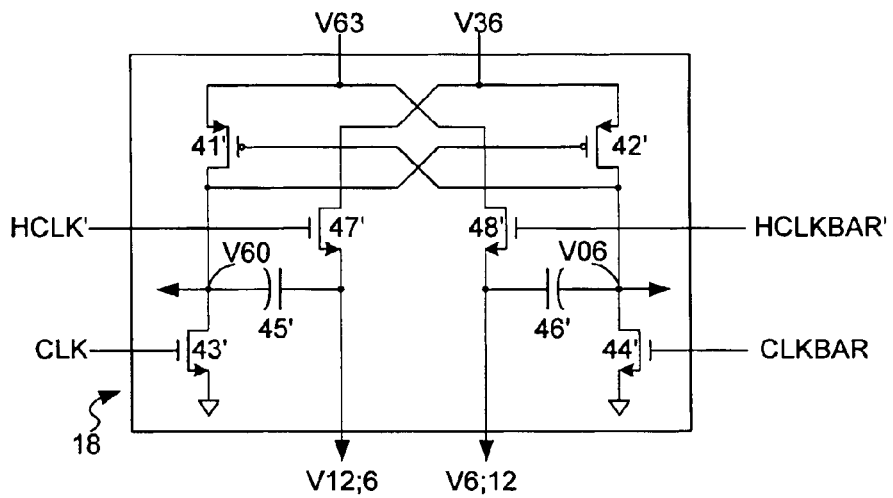
FIG. 8 is a circuit diagram for the second voltage doubler stage of the charge pump of FIG. 6.

Turning now to FIG. 8, the construction and operation of second voltage doubler stage 18 is analogous, having the same structure as first voltage doubler stage 16 with corresponding elements referenced with identical numbers followed by prime ('). However, rather than receiving voltage signals V31 and V13 and produce voltage signals V63 and V36, second voltage doubler stage 18 receives voltage signals V63 and V36 and produces voltage signals V12;6 and V6;12. Similarly internal nodes V60 and V06 correspond to nodes V30 and V03 of FIG. 7.

During odd half cycles of the CLK signal, CLKBAR is high, thereby switching nMOS 44' ON, pulling node V06 towards ground. In turn, the low voltage at node V06 switches pMOS 41' ON, pulling the voltage at node V60 towards 6*VCC. Assuming that capacitor 45' has been charged to 6*VCC with respect to node V60 in a previous half cycle, the voltage at node V12;6 will be substantially equal to 12*VCC. Because HCLK' is also low at this time, nMOS 47' is OFF, thereby preventing the voltage at node V12;6 from discharging back through this transistor. Signal HCLKBAR' will be high, thereby switching nMOS 48' ON such that node V6;12 will have a voltage substantially equal to 6*VCC at this time. In addition, capacitor 46' will be charged substantially to a voltage of 6*VCC with respect to node V06.

During even half cycles of CLK, nMOS 44' and 48' will be OFF and nMOS 43' and 47' will be ON. Thus, the voltage at node V60 will be pulled towards ground, thereby switching pMOS 42' ON. Accordingly, the voltage at node V06 will rise to be substantially equal to 6*VCC. Because of the pre-charging of capacitor 46', voltage at node V6;12 will thus be substantially equal to 12*VCC. At the same time, the voltage at node V12;6 will be substantially equal to 6*VCC, thereby also charging capacitor 45' to substantially equal to 6*VCC with respect to node V60.

Figure 9:
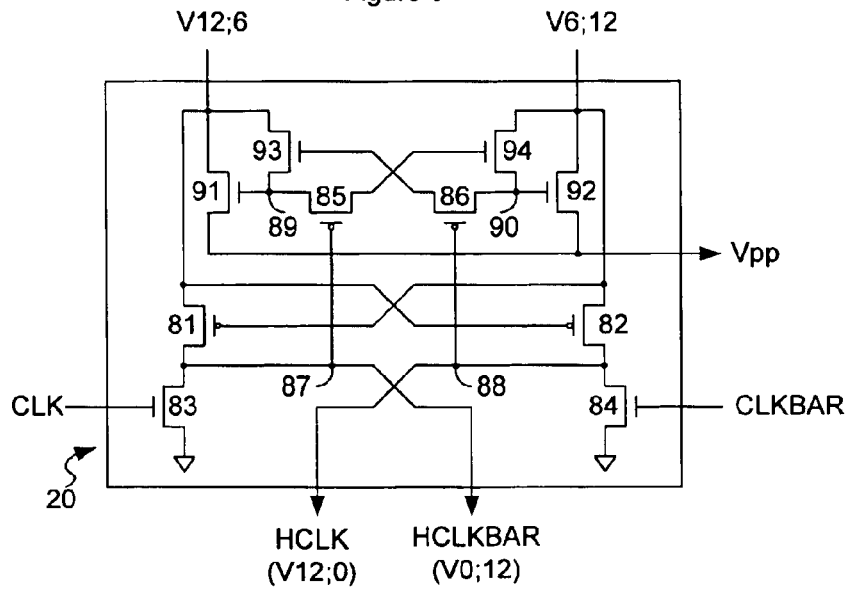
FIG. 9 is a circuit diagram for the output stage of the charge pump of FIG. 6.

Note that voltage levels equaling 12*VCC may thus be produced using only 2 voltage doubler stages 16 and 18, thereby minimizing the chip area required for charge pumps. Given voltage signals V12;6 and V6;12, it will be appreciated that many types of circuits could be used to "rectify" the two signals to produce a 12*VCC volt DC signal VPP (FIG. 9). Turning now to FIG. 9, a circuit diagram for an embodiment of an output stage 20 for producing signal VPP is illustrated. During odd half cycles of the CLK signal, CLKBAR will be high, thereby switching nMOS 84 ON and pulling node 88 towards ground. In turn, this brings the HCLK signal low. Because the gate of pMOS 82 will have a greater potential (12*VCC) than its source (6*VCC) and drain (node 88 or HCLK at ground), pMOS 82 will be OFF, preventing voltage signal V6;12 from discharging into ground. At the same time, the gate of pMOS 81 will be charged to 6*VCC while its source is at 12*VCC, switching pMOS 81 ON and charging node 87 (HCLKBAR) to 12*VCC. Accordingly, the HCLKBAR signal will be substantially equal to 12*VCC at this time. Assuming that transistor capacitor 85 has been charged to 6*VCC with respect to node 87, node 89 will be a voltage of 18*VCC. In turn, this high voltage at node 89 switches nMOS 91 ON, permitting signal VPP to be substantially equal to 12*VCC. The high voltage at node 89 will also switch nMOS 94 ON, permitting transistor capacitor 86 to be re-charged to a voltage of 6*VCC with respect to grounded node 88. Because the gate and drain (V6;12) of nMOS 92 will be at the same potential, this transistor will be switched OFF, preventing signal VPP from discharging back through this transistor. In this case the terminal V6;12 of nMOS 92 indicated as the drain is actually acting as a source since it is at a lower potential (6*VCC) than the indicated source (VPP=12*VCC). The 6*VCC voltage at node 90 will be transferred through ON pMOS 86 to the gate of nMOS 93. Since its gate voltage (6*VCC) is less than its source (12*VCC) or drain (node 89 at 12*VCC) nMOS 93 will be OFF so that the high voltage at node 89 will not discharge back through this transistor.

During even half cycles of the CLK signal, nMOS 83 will be switched ON, pulling node 87 (HCLKBAR) towards ground. The gate of pMOS 82 will be 6*VCC, lower than its source (V6;12 at 12*VCC) so that this transistor will be switched ON, permitting the HCLK signal at node 88 to rise to be substantially equal to 12*VCC volts. Signal CLKBAR will be low, thereby switching nMOS 84 OFF and preventing the HCLK signal from discharging into ground. Following the nomenclature used earlier, HCLK could also be named V12;0 and HCLKBAR could be named V0;12. At the same time, the gate of pMOS 81 will be at 12*VCC, higher than that of its source (V12;6 which is at 6*VCC), switching this transistor OFF. Because transistor capacitor 86 was previously charged to 6*VCC with respect to node 88, node 90 will have a potential of 18*VCC, switching nMOS 92 ON to keep output signal VPP at substantially 12*VCC volts. The high voltage at node 90 will also switch nMOS 93 ON, permitting transistor capacitor 85 to re-charge to 6*VCC volts with respect to node 87 and node 89 will be at 6*VCC. Because the gate and drain of nMOS 91 are at the same potential, this transistor will be switched OFF, preventing signal VPP from discharging back through this transistor. With its gate at a potential of 6*VCC, and its source at 12*VCC, and its drain at 18*VCC, nMOS 94 will also be switched OFF, preventing node 90 from discharging back to V6;12 through this transistor.

It will be appreciated that charge pump 10 of FIG. 9 may be modified to include additional voltage double stages having the same structure as first and second voltage doubler stages 16 and 18. Thus, there would be a plurality of N voltage doubler stages, starting with the first voltage doubler stage 16, followed by the second voltage doubler stage 18 and so on up to the Nth voltage doubler stage in the plurality. Referring back to FIG. 2, it can be seen that the first voltage adder stage 12 provides the first and second voltage signals in the form of V21 and V12, respectively. The second voltage adder stage 14 receives these signals and provides the third and fourth voltage signals in the form of V31 and V13, respectively. The first voltage doubler stage 16 receives V31 and V13 and provides the fifth and sixth voltage signals in the form of V63 and V36, respectively. The second voltage doubler stage 18 receives V63 and V36 and provides the seventh and eighth voltage signals, V12;6 and V6;12, respectively. Should there be a third voltage doubler stage, it would receive V12;6 and V6;12 and provide the ninth and tenth voltage signals V24;12 and V12;24, respectively. In this fashion, the Nth voltage doubler stage in the plurality would receive the voltage signals from the (N−1)th voltage doubler stage and provide the (2*N+3)th and the (2*N+4)th voltage signals, where the (2*N+3)th voltage signal would be substantially equal to 2N*3*VCC volts during odd half cycles of the CLK signal and would be substantially equal to $2^{(N-1)}*3*VCC$ volts during even half cycles of the CLK signal. The (2*N+4)th voltage signal would be complementary to the (2*N+3)th voltage signal. In turn, output stage 20 would receive the voltage signals from the Nth and final voltage doubler stage in the plurality and produce a VPP signal having an amplitude substantially equal to $2^{N}*3*VCC$ volts.

Figure 10:
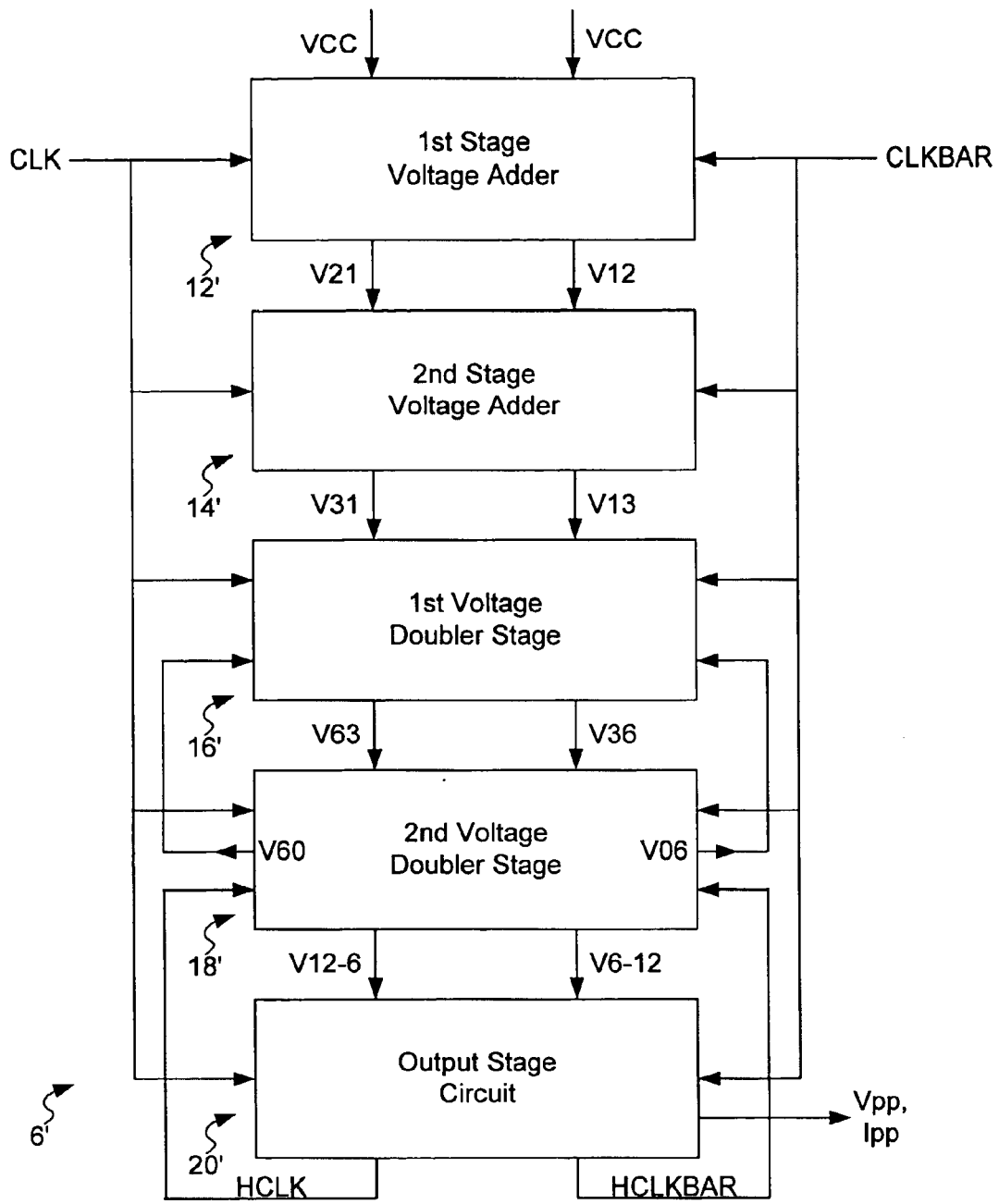
FIG. 10 is a second embodiment of FIG. 6 in which the HCLK signal for each doubler is formed from the next stage rather than from the last stage.

In the charge pump of FIG. 6 the HCLK and HCLKBAR signals required by each doubler stage are derived from a common output stage. Thus the signals labeled HCLK and HCLKBAR in FIG. 7 corresponding to stage 16 of FIG. 6 and HCLK' and HCLKBAR' in FIG. 8 corresponding to stage 18 of FIG. 6 are shown connected to the HCLK and HCLKBAR outputs respectively from output stage 20. FIG. 10 shows an alternate embodiment in which the input signals HCLK and HCLKBAR of doubler stage N are derived from additional output signals from stage N+1, and only the last doubler stage receives these signals from the output stage. In this figure, all stages are numbered identically to their corresponding stages in FIG. 6 with the addition of a prime ('). In the earlier discussion of FIG. 9, it was noted that HCLK could alternately be labeled as V12;0 and HCLKBAR as V0;12. Referring to FIG. 7 (first doubler stage) it is observed that an HCLK and HCLKBAR signal of amplitude 6*VCC is sufficient to pass the input voltage of 3*VCC to the output nodes, and similarly an amplitude of 0 volt is sufficient to block the discharge of the 6*VCC signal back to the input. Thus a V60 signal can be substituted for a V12;0 signal (HCLK), and it is sufficient that the HCLK and HCLKBAR signals come from the succeeding stage rather than from the output stage. The advantage of this embodiment is that a lower voltage signal is used on the gate and in some device technologies this may reduce the size or complexity of the associated transistors, as well as potentially increase the reliability.

Figure 11A:
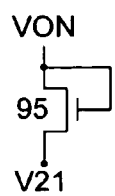
FIGS. 11a–11d are circuit diagrams of initialization circuits for the charge pump of FIG. 5 or FIG. 6.
Figure 11B:
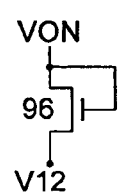
Figure 11C:
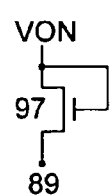
Figure 11D:
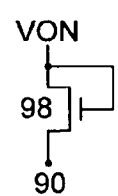

The capacitors in the first voltage adder stage 12 and output stage 20 may be precharged so that charge pump 10 may begin cycling. For example, FIGS. 11a and 11b illustrate circuits for precharging capacitors 25 and 26, respectively, of first voltage adder stage 12 at power on. By applying a voltage VON through diode transistors 95 and 96 to the nodes 29 and 30, respectively, a precharge of VON (which may equal VCC) less the threshold voltage of nMOS transistors 31 and 32 is placed across each of the capacitors 25 and 26 to initialize first voltage adder stage 12. If both CLK and CLKBAR are initially held constant at VCC before charge pump operation is started, both nodes V10 and V01 of FIG. 2 will be forced to ground such that the full VON voltage will be placed across these capacitors. As the pump begins and reaches steady state, the diode connection prevents nodes V21 and V12 from discharging back to VON. Similarly, FIGS. 10c and 10d illustrate circuits for precharging the transistor capacitors 85 and 86, respectively of FIG. 9. By applying VON through diode transistors 97 and 98 to nodes 89 and 90, respectively, a precharge of VON is placed across each of transistor capacitors 85 and 86. Similar circuits could be used to precharge the capacitors in the remaining stages of charge pump 10. In practice, however, the four precharge circuits of FIGS. 11a–11d have been found to provide satisfactory results.

Although the invention has been described with reference to particular embodiments, the description is only an example of the invention's application and should not be taken as a limitation. Consequently, various adaptations and combinations of features of the embodiments disclosed are within the scope of the invention as encompassed by the following claims.

We claim:

1. A method of generating a voltage, comprising:
providing a supply voltage VCC;
providing a clock signal having individual clock cycles;
adding VCC and VCC to produce a first voltage signal substantially equaling 2*VCC;
adding VCC to the first voltage signal to produce a second voltage signal substantially equaling 3*VCC; and
doubling the second voltage signal to produce a third voltage signal substantially equaling 6*VCC in response to a clock cycle.

2. The method of claim 1, further comprising:
doubling the third voltage signal to produce a fourth voltage signal substantially equaling 12*VCC in response to a clock cycle.

3. A charge pump, comprising:
a first voltage adder stage receiving an input voltage VCC, the first voltage adder stage operable to provide, in response to a clock signal having a first and a second phase, a first and a second voltage signal, the first voltage signal being substantially equal to 2*VCC during the first phase of the clock signal and VCC during the second phase of the clock signal, the second voltage signal being complementary to the first voltage signal; and
a second voltage adder stage receiving the input voltage VCC and the first and second voltage signals, the second voltage adder stage operable to provide, in response to the clock signal, a third and a fourth voltage signal, the third voltage signal being substantially equal to 3*VCC during the first phase of the clock signal and VCC during the second phase of the clock signal, the fourth voltage signal being complementary to the third voltage signal.

4. The charge pump of claim 3, further comprising:
one or more voltage adder stages, the nth voltage adder stage for an integer n>2 receiving the input voltage VCC and the (2*n−3)th and (2*n−2)th voltage signals, and being operable to provide, in response to the clock signal, a (2*n−1)th and a (2*n)th voltage signal, the (2*n−1)th voltage signal being substantially equal to (n+1)*VCC during the first phase of the clock signal and VCC during the second phase of the clock signal, the (2*n)th voltage signal being complementary to the (2*n−1)th voltage signal.

5. The charge pump of claim 3, further comprising:
a plurality of voltage doubler stages, a first voltage doubler stage in the plurality receiving the third and fourth voltage signals and providing a fifth and sixth voltage signal to a second voltage doubler stage in the plurality and so on, wherein a kth voltage doubler stage for an integer k greater than 0 receives the (2*k+1)th and the (2*k+2)th voltage signals, the kth voltage doubler stage operable to provide, in response to the clock signal, the (2*k+3)th and the (2*k+4)th voltage signals, the (2*k+3)th voltage signal being substantially equal to $3*2^{k}*VCC$ during the first phase of the clock signal and $3*2^{(k-1)}*VCC$ during the second phase of the clock signal, the (2*k+4)th voltage signal being complementary to the (2*k+3)th voltage signal.

6. The charge pump of claim 3, wherein the first voltage adder stage includes a first capacitor, the charge pump being configured, in response to the clock signal, to charge the first capacitor in parallel with the input voltage VCC during the second phase of the clock signal and to couple the charged first capacitor in series with the input voltage VCC during the first phase of the clock signal such that the first capacitor may provide the first voltage signal.

7. The charge pump of claim 6, wherein the first voltage adder stage includes a second capacitor, the charge pump being configured, in response to the clock signal, to charge the second capacitor in parallel with the input voltage VCC during the first phase of the clock signal and to couple the charged second capacitor in series with the input voltage VCC during the second phase of the clock signal such that the second capacitor may provide the second voltage signal.

8. The charge pump of claim 7, wherein the second voltage adder stage includes a third capacitor, the charge pump being configured, in response to the clock signal, to charge the third capacitor in parallel with the input voltage VCC during the second phase of the clock signal and to couple the charged third capacitor in series with the first voltage signal during the first phase of the clock signal such that the third capacitor may provide the third voltage signal.

9. The charge pump of claim 8, wherein the second voltage adder stage includes a fourth capacitor, the charge pump being configured, in response to the clock signal, to charge the fourth capacitor in parallel with the input voltage VCC during the first phase of the clock signal and to couple the charged fourth capacitor in series with the second voltage signal during the second phase of the clock signal such that the fourth capacitor may provide the fourth voltage signal.

10. A method of generating a voltage signal from an input voltage VCC, comprising:

providing a clock signal;

adding the input voltage VCC responsive to the clock signal to generate a first voltage signal substantially equal to 2*VCC during a first phase of the clock signal and VCC during a second phase of the clock signal;

adding the input voltage VCC to the first voltage signal responsive to the clock signal to generate a second voltage signal substantially equal to 3*VCC during the first phase of the clock signal and VCC during the second phase of the clock signal.

11. The method of claim 10, further comprising:

doubling the second voltage signal responsive to the clock signal to generate a third voltage signal substantially equal to 6*VCC during the first phase of the clock signal and 3*VCC during the second phase of the clock signal.

12. The method of claim 11, further comprising:

doubling the third voltage signal responsive to the clock signal to generate a fourth voltage signal substantially equal to 12*VCC during the first phase of the clock signal and 6*VCC during the second phase of the clock signal.

13. The method of claim 12, further comprising:

adding the input voltage VCC responsive to the clock signal to generate a fifth voltage signal substantially equal to 2*VCC during the second phase of the clock signal and VCC during the first phase of the clock signal; and adding the input voltage VCC to the fifth voltage signal responsive to the clock signal to generate a sixth voltage signal substantially equal to 3*VCC during the second phase of the clock signal and VCC during the first phase of the clock signal.

14. The method of claim 13, further comprising:

doubling the sixth voltage signal responsive to the clock signal to generate a seventh voltage signal substantially equal to 6*VCC during the second phase of the clock signal and 3*VCC during the first phase of the clock signal.

15. The method of claim 14, further comprising:

doubling the seventh voltage signal responsive to the clock signal to generate an eighth voltage signal substantially equal to 12*VCC during the second phase of the clock signal and 6*VCC during the first phase of the clock signal.

16. A charge pump, comprising:

a first capacitor;

a first circuit for successively charging the first capacitor to an input voltage VCC and serializing the charged capacitor with the input voltage VCC, the first capacitor thereby providing a first voltage signal alternating substantially between VCC and 2*VCC;

a second capacitor;

a second circuit for successively charging the second capacitor to VCC and serializing the charged second capacitor with the input voltage 2*VCC using the first voltage signal when it equals 2*VCC, the second capacitor thereby providing a second voltage signal alternating substantially between 3*VCC and VCC; and a third circuit for multiplying the second voltage signal to provide a third voltage signal alternating substantially between 6*VCC and 3*VCC.

17. The charge pump of claim 16, wherein the first circuit is responsive to a clock signal such that the first voltage signal substantially equals 2*VCC during a first phase of the clock signal and VCC during a second phase of the clock signal.

18. The charge pump of claim 17, wherein the second circuit is responsive to the clock signal such that the second voltage signal substantially equals 3*VCC during the first phase of the clock signal and VCC during the second phase of the clock signal.

19. A charge pump that has a first charge pump stage and a plurality of subsequent charge pump stages connected in series, comprising:

a first charge pump stage having at least one capacitor having a first dielectric layer, the capacitor being configured so that the voltage across the first dielectric layer does not exceed the input voltage of the charge pump;

a second charge pump stage that receives a first input from the first charge pump stage, having at least one capacitor having a second dielectric layer, the capacitor being configured so that the voltage across the second dielectric layer does not exceed the input voltage of the charge pump; and a third charge pump stage that receives a second input from the second charge pump stage and provides an output that is twice the second input.

20. The charge pump of claim 19 wherein the first dielectric layer has a breakdown voltage that is less than a maximum voltage output of the first charge pump stage.

21. A charge pump comprising:

a plurality of charge pump stages, at least two stages being additive stages that individually produce an output voltage that is the sum of an input voltage and a supply voltage; and at least one stage being a doubling stage that produces an output voltage that is twice an input voltage.

* * * * *